(12) United States Patent
Shirotori et al.

(10) Patent No.: US 8,349,163 B2
(45) Date of Patent: Jan. 8, 2013

(54) PERPENDICULAR MAGNETIC RECORDING MEDIUM, METHOD OF MANUFACTURING THE SAME, AND MAGNETIC READ/WRITE APPARATUS

(75) Inventors: Satoshi Shirotori, Yokohama (JP); Akira Watanabe, Fuchu (JP); Yoshiyuki Kamata, Tokyo (JP); Masatoshi Sakurai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 93 days.

(21) Appl. No.: 12/961,388

(22) Filed: Dec. 6, 2010

(65) Prior Publication Data
US 2011/0132752 A1 Jun. 9, 2011

(30) Foreign Application Priority Data
Dec. 7, 2009 (JP) .................... 2009-277859

(51) Int. Cl.
*B29D 17/00* (2006.01)
*C25D 1/00* (2006.01)
*C25D 1/10* (2006.01)
*G11B 3/00* (2006.01)

(52) U.S. Cl. ............... 205/68; 205/67; 205/70; 205/78; 205/50; 204/281

(58) Field of Classification Search .................. 204/281; 205/67, 68, 70, 50, 78
See application file for complete search history.

(56) References Cited

U.S. PATENT DOCUMENTS

| 4,837,176 A * | 6/1989 | Zdebel et al. ............ 438/552 |
| 4,923,821 A | 5/1990 | Namose |
| 5,206,535 A | 4/1993 | Namose |
| 5,920,781 A * | 7/1999 | Imoto ...................... 438/301 |
| 6,478,883 B1 * | 11/2002 | Tamatsuka et al. ........ 148/33.2 |
| 6,748,865 B2 | 6/2004 | Sakurai et al. |
| 2003/0127007 A1 | 7/2003 | Sakurai et al. |
| 2005/0060874 A1 | 3/2005 | Hibi et al. |
| 2005/0204212 A1 * | 9/2005 | Noguchi et al. ............ 714/710 |
| 2009/0146181 A1 * | 6/2009 | Lai et al. .................... 257/190 |

FOREIGN PATENT DOCUMENTS

| JP | 05-83182 B1 | 11/1993 |
| JP | 07-006358 A | 1/1995 |
| JP | H08-083417 | 3/1996 |
| JP | H09-161270 | 6/1997 |
| JP | H11-353718 | 12/1999 |
| JP | 2003-157820 A | 5/2003 |
| JP | 2005-056547 | 3/2005 |
| JP | 2005-205876 | 8/2005 |
| JP | 2006-040378 | 2/2006 |
| JP | 3928024 A | 3/2007 |

OTHER PUBLICATIONS

Information Sheet for preparing an Information Disclosure Statement under Rule 1,56 (Concise explanation on Document No. JP 3928024 & JP 05-83182).

Notice of Reasons for Rejection mailed by the Japan Patent Office on Feb. 15, 2011 in corresponding Japanese patent app. No. 2009-277859 in 4 pages.

Notice of Reasons for Rejection mailed by the Japan Patent Office on May 17, 2011 in corresponding Japanese patent app. No. 2009-277859 in 6 pages.

* cited by examiner

*Primary Examiner* — Bruce Bell
(74) *Attorney, Agent, or Firm* — Knobbe, Martens, Olson & Bear, LLP

(57) ABSTRACT

According to one embodiment, an electroforming master comprises a patterns of protrusions and recesses formed on one major surface of an Si substrate having two major surfaces, corresponding to information for positioning of a read/write head (a preamble, address, and burst), recording tracks or recording bits. Impurity ions are doped in the surface of this patterns of protrusions and recesses. The impurity ion concentration distribution in the film thickness direction of the Si substrate has a peak in a portion from the patterns of protrusions and recesses surface to a depth of 40 nm in the film thickness direction. The impurity concentration of this peak is $1 \times 10^{20}$ to $2 \times 10^{21}$ ions/cm$^3$.

9 Claims, 5 Drawing Sheets

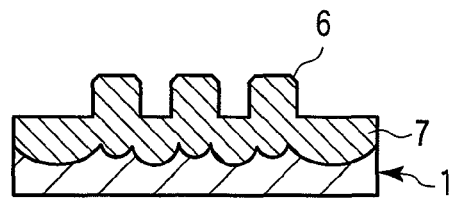
F I G. 4A
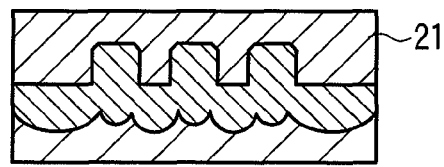
F I G. 4B
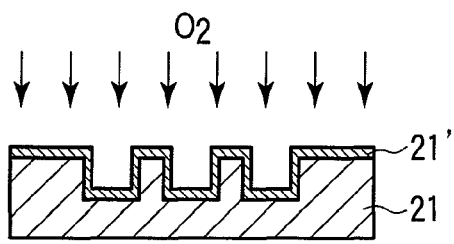
F I G. 4C
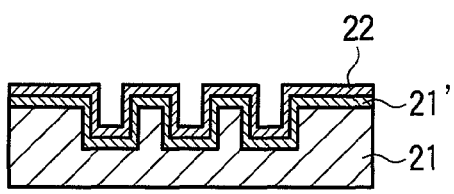
F I G. 4D
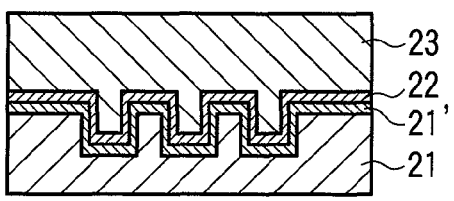
F I G. 4E
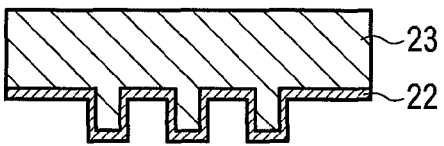
F I G. 4F

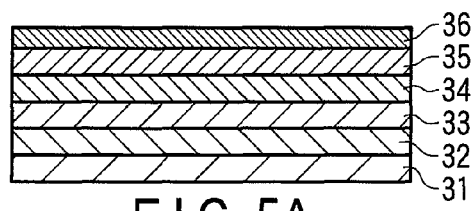
F I G. 5A
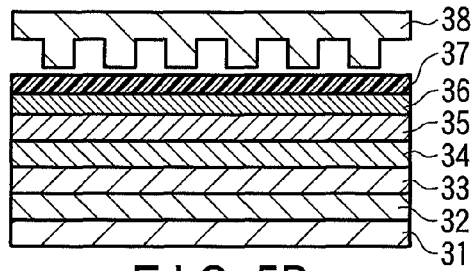
F I G. 5B
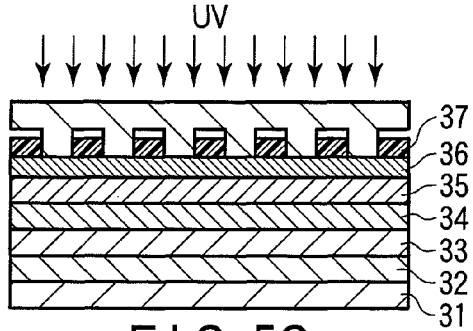
F I G. 5C
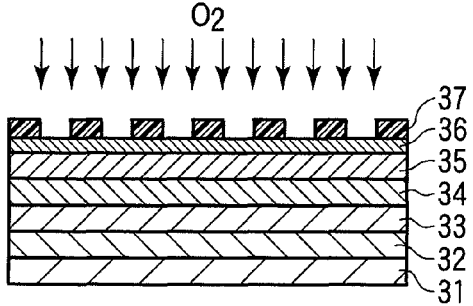
F I G. 5D
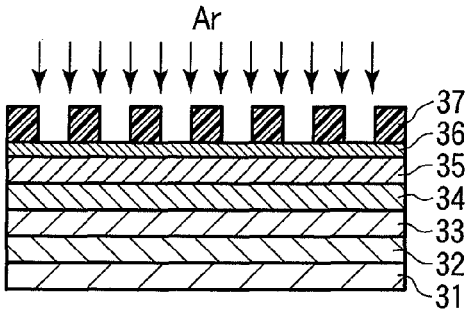
F I G. 5E
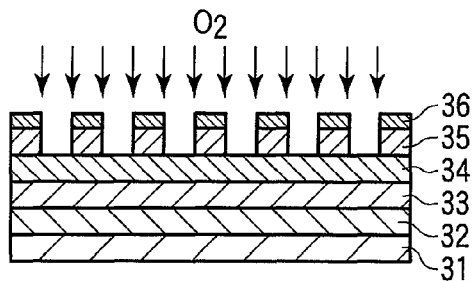
F I G. 5F
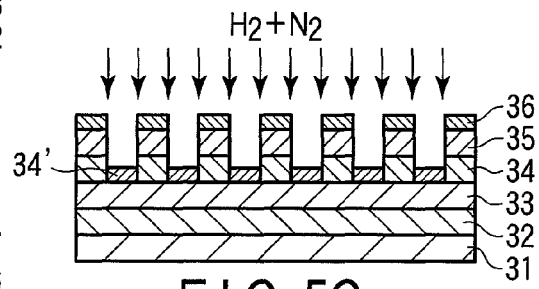
F I G. 5G
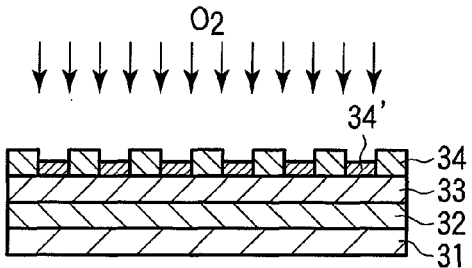
F I G. 5H
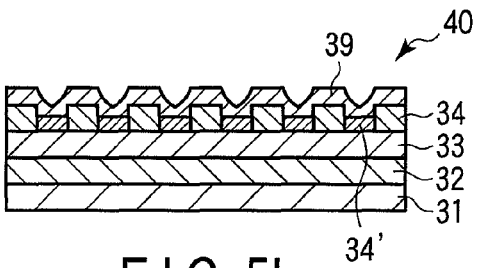
F I G. 5I

PERPENDICULAR MAGNETIC RECORDING MEDIUM, METHOD OF MANUFACTURING THE SAME, AND MAGNETIC READ/WRITE APPARATUS

CROSS-REFERENCE TO RELATED APPLICATIONS

This application is based upon and claims the benefit of priority from Japanese Patent Application No. 2009-277859, filed Dec. 7, 2009; the entire contents of which are incorporated herein by reference.

FIELD

Embodiments described herein relate generally to a technique of manufacturing a magnetic recording medium having discrete tracks or bit patterns on the surface of a magnetic recording layer and, more particularly, to an electroforming master to be used when forming a mother stamper for duplicating a resin stamper for transferring a discrete track shape or bit pattern shape.

BACKGROUND

As the track density of an HDD increases in recent years, the problem of interference with an adjacent track is becoming serious. In particular, reducing side write due to the recording head magnetic field fringe effect is an important technical subject. A discrete track pattern medium (DTR medium) in which recording tracks are physically separated can reduce the side erase phenomenon that occurs during recording and the side read phenomenon by which information of an adjacent track mixes in during reproduction, thereby increasing the density in the cross track direction. This makes the DTR medium promising as a high-density magnetic recording medium. In addition, a bit patterned medium (BPM) physically divided in the bit direction as well has been proposed as a high-density magnetic recording medium capable of suppressing the medium noise and the thermal decay phenomenon by which recorded data disappears at room temperature (see, e.g., patent reference 1).

Since the DTR medium and BPM are manufactured using the etching processing technique, the manufacturing cost may increase. Therefore, the following method has been proposed. That is, fine patterns obtained by EB (Electron Beam) lithography are transferred to a master, and an Ni stamper is duplicated from the master by electroforming. The Ni stamper is then set in an injection molding machine, and resin stampers are mass-produced by injection molding. The DTR media and BPM are manufactured by UV (UltraViolet-curing) imprinting using the resin stamper. This method can inexpensively mass-produce the DTR media and BPM. However, it is necessary to transfer fine patterns whose size is $1/10$ or less that of patterns formed on optical disks. When the patterns are downsized as the recording density increases, therefore, it has become difficult to duplicate the Ni stamper from the master by electroforming. Since an Si wafer used as the master is made of a single crystal and has etching anisotropy, highly rectangular patterns are obtained. Also, the hardness of the Si wafer is higher than that of the Ni electroformed film. When separating the Ni electroformed film (father stamper) from the master, therefore, the electroformed film is pulled by the Si master in a place where the rectangularity is high, thereby forming a burr. Also, when a conductive film for performing electroforming is deposited by sputtering, the openings of fine patterns are closed to form cavities (pores) because the deposition rate of pattern projections is higher than that of pattern recesses. Since no electroformed film is formed in master recesses, pattern transfer defects occur. Furthermore, when performing duplication by electroforming, the conductive film peels off in a portion where the adhesion between the conductive film and electroformed film is weak, thereby producing a level difference corresponding to the thickness of the conductive film. Since the level variations of the stamper lead to pattern formation defects when manufacturing the DTR medium and BPM, the on-track BER (Bit Error Rate) decreases.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

FIGS. 4A, 4B, 4C, 4D, 4E, and 4F are views showing the manufacturing steps of a father stamper and mother stamper;

FIGS. 5A, 5B, 5C, 5D, 5E, 5F, 5G, 5H and 5I are exemplary views showing a method of manufacturing a DTR medium and BPM.

DETAILED DESCRIPTION

Figure 1A:
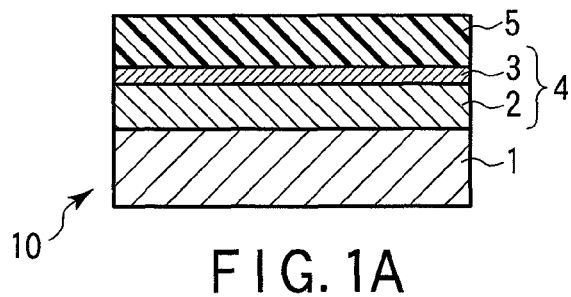
FIGS. 1A, 1B, 1C, 1D, 1E, 1F and 1G are exemplary views showing an example of an electroforming master manufacturing method according to one embodiment.

Various embodiments will be described hereinafter with reference to the accompanying drawings.

In general, according to one embodiment, an electroforming master of the embodiment is provided, which is used when forming a mother stamper for duplicating a resin stamper for transferring a discrete track shape. On one major surface of an Si substrate having two major surfaces, a patterns of protrusions and recesses corresponding to information for positioning of a read/write head (a preamble, address, and burst) and recording tracks or recording bits is formed. Impurity ions are doped in the surface of this patterns of protrusions and recesses. The impurity ion concentration distribution in the film thickness direction of the Si substrate has a peak in a portion from the patterns of protrusions and recesses surface to a depth of 40 nm in the film thickness direction. The impurity concentration of this peak is $1 \times 10^{20}$ to $2 \times 10^{21}$ ions/cm$^3$.

An electroforming master manufacturing method according to one embodiment is a method of manufacturing the above-mentioned electroforming master on which information for positioning of a read/write head (a preamble, address, and burst) and recording tracks or recording bits is formed as a patterns of protrusions and recesses, including forming a mask layer on an Si substrate, coating the mask layer with an EB lithography resist having an etching selectivity lower than that of the mask layer, thereby forming an EB lithography resist coating layer, writing the pattern of information for positioning of a read/write head (a preamble, address, and burst) and recording tracks or recording bits on the EB lithography resist coating layer by using an EB lithography apparatus, and developing the pattern, thereby forming an EB lithography resist pattern, forming a mask pattern by etching the mask layer via the EB lithography resist pattern, forming a patterns of protrusions and recesses on the Si substrate by etching the Si substrate via the mask pattern, removing the EB lithography resist pattern and mask pattern by asking, and modifying the surface of the patterns of protrusions and recesses by doping impurity ions in the surface of the patterns of protrusions and recesses.

The embodiment makes it possible to obtain an electroforming master that causes minimal pattern formation defects when performing duplication by electroforming.

When using the master according to the embodiment, fine patterns can be electroformed, and the pattern rectangularity is reduced by performing ion doping on the Si substrate after etching. This suppresses the formation of burrs during electroforming, unlike a master manufactured by transferring EB lithography patterns by etching. At the same time, the resistance of the SI master surface can be decreased by the impurity. This obviates the need to sputter any conductive film for electroforming. Since electroforming can be performed without any step of sputtering a conductive film, finer patterns can be electroformed. It is also possible to prevent the phenomenon by which when sputtering a conductive film, the conductive film is buried in the groove surfaces of fine patterns to form cavities. Furthermore, it is possible to suppress the uneven separation of the electroformed film obtained after electroforming.

In addition, the method of the embodiment can simply manufacture the above-mentioned master.

The master manufacturing method of the embodiment will be described in more detail below with reference to FIGS. 1A, 1B, 1C, 1D, 1E, 1F and 1G.

(Mask Layer Formation Step)

FIGS. 1A, 1B, 1C, 1D, 1E, 1F and 1G are views showing an example of the electroforming master manufacturing method of the embodiment.

First, as shown in FIG. 1A, an Si substrate 1 having a diameter of 6 inches was prepared as a substrate, and a mask layer 4 was formed on the substrate 1.

According to one embodiment, a substrate having a low impurity concentration can be used as the Si substrate 1. When forming patterns of 10 nm or less, the pattern variation increases if the substrate impurity increases. According to the embodiment, the etching selectivity of the mask layer 4 can be made higher than that of an EB lithography resist, and lower than that of the Si substrate 1. The number of layers and material of the mask layer are not particularly limited. "The etching selectivity is high" means that the etching rate is higher than that of an EB lithography resist under the same etching conditions. A multilayered structure can be used to simply perform etching by using a fluorine-based gas or oxygen gas. A mask having a high aspect ratio can be formed by using a stack including a carbon (C) layer 2 and silicon (Si) layer 3 as the mask layer 4. A 3 nm Si layer and a 40 nm C layer are deposited at, e.g., DC 200 W and 0.6 Pa. The Si in the Si layer 3 has a reactive ion etching (RIE) rate higher than that of an EB lithography resist when using fluorine-based gas. The C in the C layer 2 has an RIE rate higher than that of an EB lithography resist when using oxygen gas. The deposition method is physical vapor deposition or chemical vapor deposition. If the thickness of the mask layer 4 is less than 2 nm, it is often impossible to obtain a uniform film. If the thickness of the mask layer 4 exceeds 50 nm, the roughness tends to increase. Accordingly, the thickness of the mask layer 4 can be 2 to 50 nm. The thickness of the mask layer 4 can also be selected to obtain a desired etching resistance, taking into account the etching selectivity of the material.

Si can be etched by RIE using a fluorine-based gas, and has a high etching resistance against oxygen gas. On the other hand, C can be etched by RIE using oxygen gas, and has a high etching resistance against fluorine-based gas. Therefore, the mask configuration using Si and C makes it possible to simply form a mask having a high aspect ratio.

(Resist Patterning Step)

Resist ZEP-520A, available from ZEON, was diluted to twice the volume with anisole, and the solution was filtered through a 0.05-μm filter. The mask layer 4 was spin-coated with the resist solution and prebaked at 200° C. for 3 min, thereby forming a resist layer 5 about 30 nm thick (FIG. 1A). Subsequently, an electron beam lithography apparatus 15 having a ZrO/W thermal field emission type electron gun emitter was used to directly write desired patterns on the resist on the substrate at an acceleration voltage of 50 kV.

This lithography was performed using a signal source that synchronously generates a signal for writing the patterns, a signal to be supplied to a stage driving system (a so-called X-θ stage driving system including a moving mechanism having a moving axis in at least one direction and a rotating mechanism) of the lithography apparatus, and an electron beam deflection control signal. During the lithography, the stage was rotated at a CLV (Constant Linear Velocity) of 500 mm/s, and moved in the radial direction as well. Also, concentric track areas were written by deflecting the electron beam for every rotation. Note that the feeding speed was 7.8 nm per rotation, and one track (equivalent to one address bit width) was formed by ten rotations.

Figure 2:
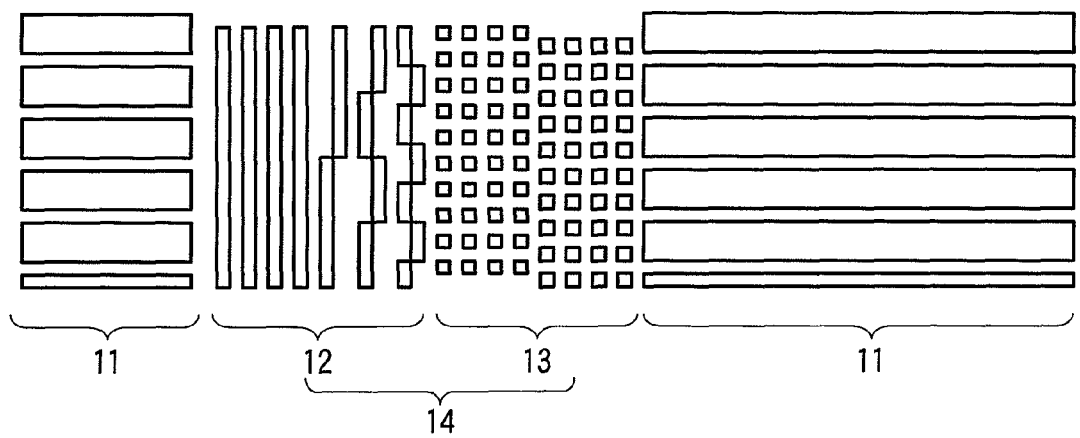
FIG. 2 is a front view showing an example of a patterns of protrusions and recesses recording information for positioning of a read/write head and recording tracks.
Figure 3:
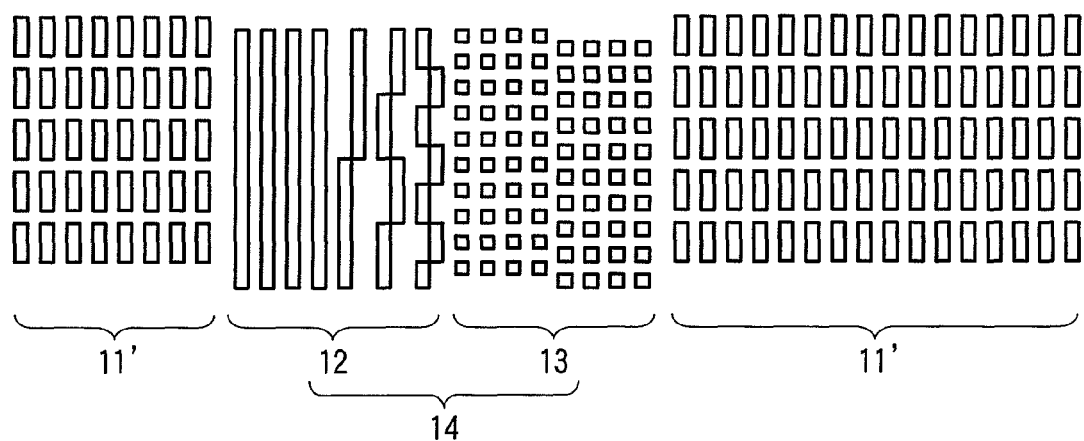
FIG. 3 is a front view showing an example of a patterns of protrusions and recesses of information for positioning of a read/write head and recording bits.

FIG. 2 is a front view showing an example of a patterns of protrusions and recesses recording information for positioning of a read/write head and recording tracks. FIG. 3 is a front view showing an example of a patterns of protrusions and recesses of information for positioning of a read/write head, and recording bits.

Examples of the lithography pattern described above are a pattern corresponding to a track pattern 11 formed in a data area and a servo area pattern 14 including a preamble address pattern 12 and burst pattern 13 formed in a servo area, as shown in FIG. 2, and a pattern corresponding to a bit pattern 11' formed in a data area and a servo area pattern 14 including a preamble address pattern 12 and burst pattern 13 formed in a servo area, as shown in FIG. 3.

Figure 1B:
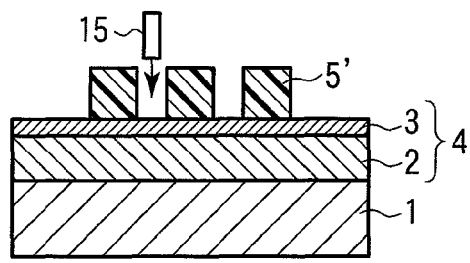

Subsequently, the resist was developed by dipping the substrate in developer ZED-N50 (available from ZEON) for 90 sec. After that, the substrate was rinsed by dipping it in ZMD-B (available from ZEON) for 90 sec, and dried by air blow, thus obtaining resist pattern 5' by resist patterning (FIG. 1B).

(Etching Step)

Figure 1E:
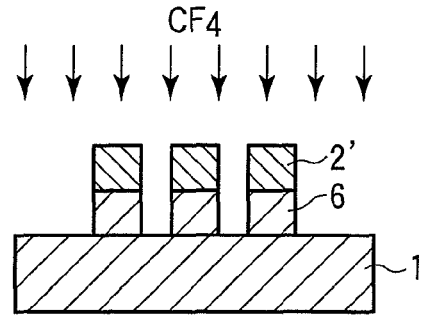
Figure 1C:
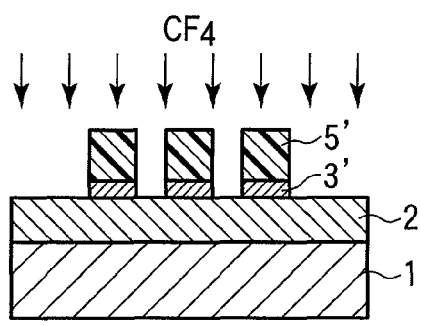
Figure 1F:
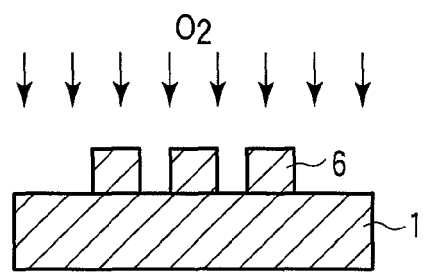
Figure 1D:
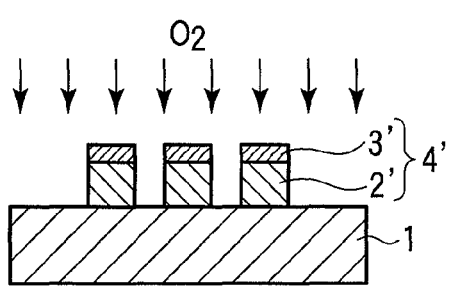

Based on the resist pattern 5', Si of the mask layer 1 is etched by using an ICP etching apparatus. For example, an Si pattern 3' is obtained by etching the Si layer 3 by using $CF_4$ as a process gas at a chamber pressure of 0.1 Pa, an antenna power of 100 W, and a bias power of 5 W (FIG. 1C). Then, the C layer 2 is etched with oxygen gas based on the Si pattern 3'. For example, a C pattern 2' is obtained by etching the C layer by using $O_2$ as a process gas at a chamber pressure of 0.1 Pa, an antenna power of 100 W, and a bias power of 5 W. This process simultaneously removes the EB lithography resist pattern 5' (FIG. 1D). The Si substrate 1 is then etched based on the C pattern 2'. For example, the Si substrate 1 is etched by using $CF_4$ as a process gas at a chamber pressure of 0.1 Pa, an antenna power of 100 W, and a bias power of 5 W. This process simultaneously removes the Si pattern 3' (FIG. 1E).

(Asking Step)

The C pattern 2' is removed with oxygen gas by using the ICP etching apparatus. For example, the C pattern 2' is removed by using $O_2$ as a process gas at a chamber pressure of 0.1 Pa, an antenna power of 400 W, and a bias power of 0 W, thereby obtaining a master formed by a patterns of protrusions and recesses including the Si substrate (FIG. 1F). Also, an Si oxide layer is formed from the substrate surface to about 5 nm by this oxygen gas RIE.

(Surface Modification Step)

Figure 1G:
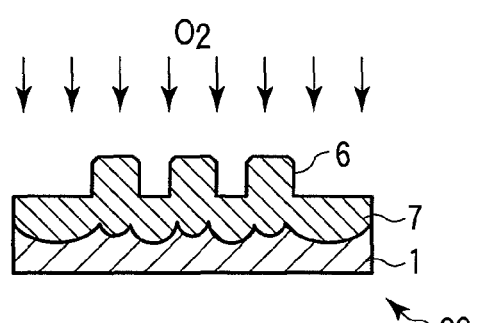

An impurity is ion-implanted into the etched Si substrate (FIG. 1G). In this step, the rectangularity of a patterns of protrusions and recesses 6 is also reduced. This surface modification step can suppress the formation of burrs during electroforming. Although this shape deformation is presumably caused due to compression stress, the rectangularity can be controlled because the stress can be controlled by the implantation energy. In addition, electrical characteristics can be imparted by redistributing the impurity by thermal diffusion. A low-resistance region 7 is formed by doping the impurity in the surface of the Si substrate, thereby giving the Si substrate itself electrical characteristics. Since this makes electroforming possible without depositing any conductive film on the pattern, the formation of cavities by a conductive film is suppressed. On the other hand, fine pattern formation requires an Si substrate having a low impurity concentration. This makes it difficult to supply electrons to the whole substrate by forming an electrode in a portion of the substrate. In the ion implantation, therefore, the resistance of the pattern outermost surface as an electroforming surface must be decreased. To perform electroforming, the impurity concentration near the patterns of protrusions and recesses surface is $1\times10^{20}$ to $2\times10^{21}$ ions/cm$^3$. When the impurity concentration is $1\times10^{20}$ ions/cm$^3$ or more, the resistivity of the substrate is $1\times10^{-3}$ $\Omega\cdot$cm or less, so an electroformed film can be obtained. If the impurity concentration is higher than $2\times10^{21}$ ions/cm$^3$, the impurity forms a solid solution, and a resistance distribution is produced between the solid solution portion and a non-solid solution portion.

To impart the electrical characteristics, the peak position of the impurity concentration can be set in the vicinity of the patterns of protrusions and recesses surface, i.e., from the three-dimensional surface to a depth of 40 nm in the film thickness direction. If the impurity concentration peak position exceeds a depth of 40 nm from the patterns of protrusions and recesses surface, it becomes difficult to set the resistance on the pattern outermost surface to $1\times10^{20}$ ions/cm$^3$ or more. The impurity concentration peak position has a correlation with the implantation energy: as the implantation energy increases, the impurity concentration peak position moves away from the vicinity of the surface. Examples of the impurity are phosphorus (P), boron (B), arsenic (As), antimony (Sb), tin (Sn), gallium (Ga), aluminum (Al), and lithium (Li), but it is also possible to use P, B, or As having a high solid-solubility limit in silicon.

The impurity concentration peak position tends to exceed 40 nm at an implantation energy of 30 keV or more when using P as the impurity, and at an implantation energy of 50 keV or more when using As as the impurity. This often makes it difficult to obtain a resistance on the outermost surface to such an extent that electroforming cannot be performed. When using B as the impurity, the impurity concentration peak position tends to exceed 40 nm at an implantation energy of 50 keV or more. Also, to reduce the pattern rectangularity, the implantation energy can be 5 keV (inclusive) to 20 keV (inclusive). If the implantation energy is less than 5 keV, the rectangularity cannot be reduced. If the implantation energy exceeds 20 keV, the pattern deformation increases, and this often makes it difficult to perform desired pattern transfer.

Furthermore, when using P as the impurity, the migration of the impurity in the direction of a plane increases. This makes it possible to uniformly diffuse the impurity even in a patterns of protrusions and recesses of a substrate. The impurity ions often gather at the boundary between a surface oxide film and Si. Therefore, the impurity ions can be concentrated in the vicinity of the outermost surface by removing the oxide film. This makes P more suitable as the impurity. For example, ion implantation is performed by using P as the impurity at an energy of 10 keV and an implantation amount of $2.2\times10^{15}$ ions/cm$^2$. After the impurity is redistributed by thermal diffusion at 1,000° C., an oxide film on the outermost surface is removed by hydrofluoric acid. This makes it possible to manufacture a master 20 made of the Si substrate in which the impurity concentration on the substrate surface is $1\times10^{21}$ ions/cm$^3$ and the rectangularity is reduced.

Mother Stamper Manufacturing Method

A method of manufacturing a mother stamper by an electroforming step will be described below with reference to FIGS. 4A, 4B, 4C, 4D, 4E, and 4F.

FIGS. 4A, 4B, 4C, 4D, 4E, and 4F are views showing the steps of manufacturing a father stamper and mother stamper.

An electrode was brought into contact with a doping area 7 of the surface of a master 1 (FIG. 4A), and Ni electroforming was performed for 90 min by dipping the master 1 in a nickel sulfamate plating solution (NS-160 available from Showa Chemical Industry), thereby forming an electroformed film 21 of about 300 μm thickness (FIG. 4B). The electroforming bath conditions were as follows.

Nickel sulfamate: 600 g/L
Boric acid: 40 g/L
Surfactant (sodium lauryl sulfate): 0.15 g/L
Solution temperature: 55° C.
pH: 4.0
Current density: 20 A/dm$^2$ Subsequently, the electroformed film 21 is separated from the master 1. The stamper manufactured as described above will be called a father stamper. The master 1 and father stamper 21 can be separated from each other from the electroforming surface. After that, a passivation process is performed on the surface of the Ni father stamper 21 by oxygen RIE (Reactive Ion Etching), thereby oxidizing the surface and obtaining an oxide film 21' (FIG. 4C). More specifically, oxygen RIE was performed for 3 min by applying a power of 100 W into a chamber in which the pressure was adjusted to 4 Pa by supplying oxygen gas at 100 mL/min. Then, a conductive film 22 is deposited on the surface by sputtering (FIG. 4D), and a mother stamper 23 is obtained by electroforming the conductive film 22 (FIGS. 4E and 4F). The father stamper 21 and mother stamper 23 can be separated from each other from the oxide layer 21'.

After that, the inner and outer diameters of the stamper are punched before lower-surface polishing is performed. After the upper surface of the stamper was coated with a protective film (trade name: Silitect), the stamper was set in a punching apparatus (SIBERT OMICRON), a ring-like metal blade having an outer diameter of 75 mm and an inner diameter of 7 mm was centered such that the center of the blade was aligned with the center of the pattern formed on the stamper, and punching was performed. The punched stamper was polished so that the lower surface became a mirror surface. "The mirror surface polishing" herein mentioned is on a level capable of light reflection, and the surface roughness (Ra) is about 50 nm or less.

Magnetic Recording Medium Manufacturing Method

A method of manufacturing a DTR medium and BPM will be explained below with reference to FIGS. 5A, 5B, 5C, 5D, 5E, 5F, 5G, 5H, and 5I.

First, the Ni stamper manufactured by the method explained with reference to FIGS. 1A, 1B, 1C, 1D, 1E, 1F, and 1G, 2, 3, and 4A, 4B, 4C, 4D, 4E, and 4F is set in an injection molding machine (manufactured by TOSHIBA MACHINE), and a resin stamper is manufactured. Although the molding material is cyclic olefin polymer ZEONOR 1060R available from ZEON, polycarbonate material AD5503 available from TEIJIN CHEMICALS may also be used. After that, as shown in FIG. 5A, a 120-nm thick soft magnetic layer 32 (CoZrNb), 20-nm thick orientation controlling underlayer 33 (Ru), 15-nm thick ferromagnetic recording layer 34 (CoCrPt—$SiO_2$), and 15-nm thick protective layer 35 (C) are sequentially deposited on a glass substrate 31. A metal layer 36 (3 to 5 nm) is deposited on the protective layer 35. A metal used as the metal layer 36 is a material having high adhesion to a 2P (photopolymer) agent, and is completely removable by etching using He+$N_2$ gas in a step shown in FIG. 5G. Practical examples are CoPt, Cu, Al, NiTa, Ta, Ti, Si, Cr, NiNb, and ZrTi. Of these materials, CoPt, Cu, and Si are particularly superior in balance between the 2P agent adhesion and the removability by He+$N_2$ gas.

Note that the 2P agent is an ultraviolet-curing material made of a monomer, oligomer, and polymerization initiator, and does not contain any solvent.

As shown in FIG. 5B, a UV-curing resin layer 37 is formed by spin-coating the metal layer 36 with a 50-nm thick photopolymer (2P) agent. The 2P agent is an ultraviolet-curing material made of a monomer, oligomer, and polymerization initiator. An example is a material containing isobornyl acrylate (IBOA) as a monomer, polyurethane diacrylate (PUDA) as an oligomer, and DAROCUR 1173 as a polymerization initiator, such that the contents of IBOA, PUDA, and the polymerization initiator are respectively 85%, 10%, and 5%. After that, a resin stamper 38 is used to perform imprinting on the UV-curing resin layer 37 (FIG. 5C).

Subsequently, oxygen gas is used to remove the imprinting residue by using an ICP etching apparatus. For example, the residue formed by the imprinting process is removed by using oxygen as a process gas at a chamber pressure of 2 mTorr, a coil RF of 100 W, and a platen RF of 100 W for an etching time of 30 sec (FIG. 5D).

The metal layer 36 is then etched by ion beam etching using Ar gas (FIG. 5E). This step is not always necessary and may be omitted. For example, the metal layer 36 can also be etched by increasing the anisotropy (e.g., increasing the platen RF of the ICP conditions to about 300 W) in the imprinting residue removing step (FIG. 5D). When using Si as the metal layer 36, ion beam etching using $CF_4$ gas can also be used.

In the imprinting residue removing step, the resist residue is removed by RIE (Reactive Ion Etching). The plasma source can be an ICP (Inductively Coupled Plasma) that can be generated with a high density at a low pressure. However, it is also possible to use an ECR (Electron Cyclotron Resonance) plasma or a general parallel-plate RIE apparatus. Oxygen gas can be used as the 2P agent.

After that, the protective layer 35 is etched by the ICP etching apparatus by using oxygen gas. A C mask is then formed by using oxygen as a process gas at a chamber pressure of 2 mTorr, a coil RF of 100 W, and a platen RF of 100 W for an etching time of 30 sec (FIG. 5F).

Ion beam etching is performed through the formed C mask by using He or He+$N_2$ (mixing ratio of 1:1) (FIG. 5G). ECR can be used in the ionization of the gas. For example, etching is performed at a microwave power of 800 W and an acceleration voltage of 1,000 V for 20 sec, thereby forming a 10-nm thick patterns of protrusions and recesses that partially divides the ferromagnetic recording layer 34. A 5-nm thick residue of the ferromagnetic recording layer 34 deactivates the magnetism owing to the effect of the exposure to He+$N_2$, thereby forming a magnetism-deactivated layer 34'.

In this step, it is important to completely remove the metal layer 36 (e.g., Cu) formed in the step shown in FIG. 5A at the same time. This is so because if the metal layer 36 remains, the C mask protected by the metal layer cannot be removed in the next C mask removing step performed by RIE using oxygen gas.

After that, the C mask is removed by RIE using oxygen gas at 100 mTorr and 100 W for an etching time of 30 sec (FIG. 5H). It is also possible to readily remove the C mask by oxygen plasma processing. In this step, a carbon protective layer on the surface of a perpendicular magnetic medium is also removed.

Finally, a 4-nm thick surface C protective film 39 is formed by CVD (FIG. 5I) and coated with a lubricant, thereby obtaining a DTR medium 40 or BPM.

The C protective film is desirably deposited by CVD in order to improve the coverage to the patterns of protrusions and recesses coverage. However, the C protective film may also be deposited by sputtering or vacuum deposition. When forming the C protective film by CVD, a DLC film containing a large amount of $sp^3$-bonded carbon is formed. If the film thickness is 2 nm or less, the coverage worsens. If the film thickness is 10 nm or more, the magnetic spacing between a magnetic read/write head and the medium increases, and this often decreases the SNR. A lubricating layer can also be formed on the protective layer. As a lubricant for use in the lubricating layer, it is possible to use a conventionally known material, e.g., perfluoropolyether, alcohol fluoride, or fluorinated carboxylic acid.

EXAMPLES

Example 1

Formation Example of Master

A master was manufactured by the method shown in FIGS. 1A, 1B, 1C, 1D, 1E, 1F, and 1G. P was used as an impurity for ion implantation, and the implantation energy was set at 10 keV. After the ion doping, the impurity was redistributed by thermal diffusion, and a surface oxide film was removed by hydrofluoric acid. Then, the impurity concentration was measured using SIMS (Secondary Ion Mass Spectrometry). Consequently, an impurity concentration of $1.0 \times 10^{21}$ ions/$cm^3$ was obtained in a position 5 nm from the surface. Also, sectional observation by a TEM (Transmission Electron Microscope) was performed before and after the ion doping. As a consequence, the rectangularity reduced after the ion doping.

IMX-3500RS manufactured by ULVAC was used in the ion doping.

Example 2

Formation Example of Master and Father Stamper

Masters were manufactured following the same procedure as in Example 1. While the implantation energy was fixed to 10 keV, the masters were prepared by changing the impurity peak concentration from $1\times10^{20}$ to $2\times10^{21}$ ions/cm$^3$ by changing the implantation amount. Subsequently, father stampers were manufactured by the method shown in FIGS. 5A, 5B, 5C, 5D, 5E, 5F, 5G, 5H, and 5I. Consequently, it was possible to manufacture the father stampers.

Comparative Example 1

Example in which Impurity Concentration was Less than $1\times10^{20}$ Ions/cm$^3$ Father stampers were manufactured following the same procedure as in Example 2 except that the impurity concentration in Example 2 was changed to $1\times10^{19}$ and $5\times10^{19}$ ions/cm$^3$. When the impurity concentration was $5\times10^{19}$ ions/cm$^3$, the current value of electroforming for manufacturing the father stamper was higher than that in Example 2, and the resistance increased. In addition, the pattern of the manufactured father stamper had a defect, i.e., no uniform electroforming could be performed. When the impurity concentration was $1\times10^{19}$ ions/cm$^3$, the resistance further increased, and no electroforming could be performed.

Comparative Example 2

Example in which Impurity Concentration was Higher than $2\times10^{21}$ Ions/cm$^3$ A father stamper was manufactured following the same procedure as in Example 2 except that the impurity concentration in Example 2 was changed to $3\times10^{21}$ ions/cm$^3$. Consequently, the manufactured father stamper had a pattern defect, i.e., no uniform electroforming could be performed. When performing sectional TEM observation on the master, the deposition of an impurity probably due to impurity doping exceeding the solid-solubility limit was found. This corresponded to the pattern defect of the father stamper.

Example 3

Formation Example of Master (Implantation Energy) and Father Stamper

Masters were manufactured following the same procedure as in Example 1. While the peak concentration of an impurity was fixed at $1\times10^{21}$ ions/cm$^3$, the masters were prepared by changing the implantation energy from 5 to 20 keV. Subsequently, father stampers were manufactured by the method shown in FIGS. 5A, 5B, 5C, 5D, 5E, 5F, 5G, 5H, and 5I, and the impurity concentration and peak position of each master used were checked by an SIMS (Secondary Ion Mass Spectrometer). Also, the master shape after the implantation was checked by an AFM (Atomic Force Microscope).

Table 1 below shows the obtained results.

TABLE 1

| | Comparative Example 3 | | Examples 3 & 7 | | | Comparative Examples 4 & 6 | | | |
|---|---|---|---|---|---|---|---|---|---|
| Implantation energy (keV) | 1 | 3 | 5 | 10 | 20 | 30 | 40 | 50 | 100 |
| Possibility of electroforming | o | o | o | o | o | Δ | x | x | x |
| Impurity concentration peak position | 10 | 14 | 16 | 18 | 30 | 42 | 51 | 63 | 70 |

TABLE 1-continued

| | Comparative Example 3 | | Examples 3 & 7 | | | Comparative Examples 4 & 6 | | | |
|---|---|---|---|---|---|---|---|---|---|
| (nm) | | | | | | | | | |
| Presence/absence of burr | Present | Present | Absent | Absent | Absent | Absent | — | — | — |

The impurity concentration peak position was 40 nm or less, and electroforming was possible in all cases.

The shape (rectangularity) before the ion implantation changed after that, and the father stampers had no burr.

Comparative Example 3

Example in which Implantation Energy was 5 keV or Less

Father stampers were manufactured following the same procedure as in Example 3 except that the implantation energy in Example 3 was changed to 1 and 3 keV.

The shape before the ion implantation remained unchanged after that, and the father stampers had burrs on projections.

Comparative Example 4

Example in which Implantation Energy was 20 keV or More

Father stampers were manufactured following the same procedure as in Example 3 except that the implantation energy in Example 3 was changed from 40 to 100 keV.

The shape before the ion implantation largely changed after that. In addition, the father stamper had a pattern defect when the implantation energy was 30 keV, and no electroforming could be performed when the implantation energy was 40 keV or more.

Example 4

Formation Example of Master (Fine Pattern) and Father Stamper

A master was manufactured following the same procedure as in Example 1. Subsequently, a father stamper was manufactured by the method shown in FIGS. 4A, 4B, 4C, 4D, 4E, and 4F. In addition, masters were prepared by changing the master recess width to 3, 7, 10, 15, 20, 25, 40, 60, 80, and 100 nm.

Figure 6:
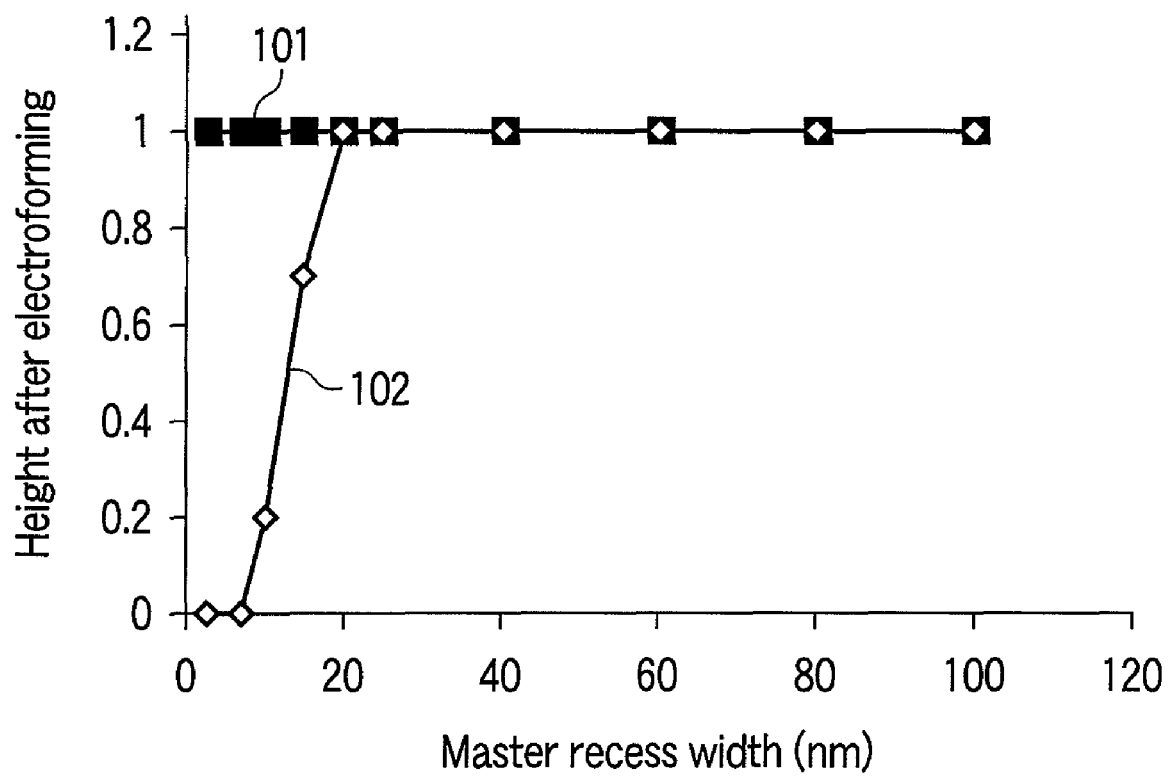
FIG. 6 is a graph showing the relationship between the patterns of protrusions and recesses height after electroforming and the master recess width.

FIG. 6 shows the obtained results.

FIG. 6 is a graph showing the relationship between the patterns of protrusions and recesses height after electroforming and the master recess width.

Referring to FIG. 6, the height after electroforming is normalized by assuming that the patterns of protrusions and recesses height of the master is 1. Performing duplication by electroforming even when the master recess width was 3 nm was easily attainable.

Comparative Example 5

Example of Conductive Film Sputtering and Father Stamper

A master was manufactured by the method shown in FIGS. 1A, 1B, 1C, 1D, 1E, 1F, and 1G except that no surface modification step was performed by ion doping, and a father stamper was manufactured by the method shown in FIGS. 4A, 4B, 4C, 4D, 4E, and 4F. Following the same procedure as in Example 4, masters were prepared by changing the master recess width to 3, 7, 10, 15, 20, 25, 40, 60, 80, and 100 nm. Ni was used as the conductive film shown in FIG. 6, and the film was deposited to a thickness of 10 nm.

FIG. 6 shows the obtained results.

As shown in FIG. 6, cavities were formed during the sputtering of the conductive film when the recess width was smaller than 20 nm. Consequently, the patterns of protrusions and recesses height after electroforming decreased, and it was impossible to perform duplication by electroforming.

Example 5

Formation Example of Master and Mother Stamper

A master was manufactured following the same procedure as in Example 1, and then a mother stamper was manufactured by the method shown in FIGS. 4A, 4B, 4C, 4D, 4E, and 4F. For comparison, another master was manufactured as a conventional example following the same procedure as shown in FIGS. 1A, 1B, 1C, 1D, 1E, 1F, and 1G except that neither a conductive layer nor a pattern layer was formed on an Si substrate. A mother stamper was then manufactured following the same procedures as shown in FIGS. 4A, 4B, 4C, 4D, 4E, and 4G. As the conductive film 22 shown in FIGS. 4D to 4F, Ni was deposited to a thickness of 10 nm on both a father stamper and the mother stamper. After that, a surface optical test was conducted by using Micro-MAX (manufactured by VISION PSYTEC). As a consequence, uneven patterns were found here and there in the conventional example. When the uneven portions were observed with an AFM (Atomic Force Microscope), the patterns of protrusions and recesses height increased by an amount corresponding to the conductive film thickness. On the other hand, the mother stamper using the master of the embodiment had no variation in patterns of protrusions and recesses height.

Example 6-1

Example in which Impurity was Changed

A master was manufactured following the same procedure as in Example 1. Subsequently, masters were manufactured following the same procedure as in Example 1 except that As and B were used as impurities for ion implantation. When using P as an impurity, the impurity ions readily gather at the interface between $SiO_2$ and Si, so the impurity concentration peak is presumably nearer to the surface than when using As as an impurity. Ion doping was performed using each impurity so that the impurity peak concentration was $1\times10^{21}$ ions/$cm^3$. The resistivity was $2\times10^{-4}$ Ω·cm when using P as the impurity, $7\times10^{-4}$ Ω·cm when using As as the impurity, and $6\times10^{-4}$ Ω·cm when using B as the impurity. When sectional observation using a TEM was performed before and after the ion doping, the rectangularity reduced after the ion doping regardless of the impurity, and it was possible to obtain a father stamper having no pattern defect. When using P as the impurity, however, the resistance decreased, and it was possible to more stably supply an electric current.

Example 6-2

Example in which Impurity was Changed

A master was manufactured following the same procedure as in Example 1. Subsequently, masters were manufactured following the same procedure as in Example 1 except that Sb, Sn, Ga, Al, and Li were used as impurities for ion implantation. The resistivity was $1\times10^{-3}$ Ω·cm when using Sb as the impurity, $1\times10^{-3}$ Ω·cm when using Sn as the impurity, $3\times10^{-3}$ Ω·cm when using Ga as the impurity, $5\times10^{-3}$ Ω·cm when using Al as the impurity, and $1\times10^{-3}$ Ω·cm when using Li as the impurity. When sectional observation using the TEM was performed before and after the ion doping, the rectangularity reduced after the ion doping regardless of the impurity, and it was possible to manufacture a father stamper having no burr. However, a defect presumably caused by a solid solution was found in a part of the pattern. When using P, B, or As as the impurity, it was possible to more stably supply an electric current. Even when using Sb, Sn, Ga, Al, or Li as the impurity, however, it was possible to manufacture a father stamper having no burr.

Example 7

Manufacture of Master and DTR Medium

DTR media were manufactured by using the masters (the implantation energies were 5, 10, and 20 keV) and Ni stampers obtained in Example 3.

The master patterns had a track pitch of 75 nm and a groove width of 25 nm, i.e., had the same shape. After that, a mother stamper was manufactured through the steps shown in FIGS. 4A, 4B, 4C, 4D, 4E, and 4F, and a DTR medium was manufactured through the steps shown in FIGS. 5A, 5B, 5C, 5D, 5E, 5F, 5G, 5H and 5I.

Cyclic olefin polymer ZEONOR 1060R, available from ZEON, was used as the molding material.

A medium shown in FIG. 5A was obtained by sequentially depositing a 120-nm thick soft magnetic layer 32 (CoZrNb), 20-nm thick orientation controlling underlayer 33 (Ru), 15-nm thick ferromagnetic recording layer 34 (CoCrPt—$SiO_2$), and 15-nm thick protective layer 35 (C) on a glass substrate 31, and 3-nm thick Cu was deposited as a metal layer 36 on the protective layer 35 in order to increase the adhesion to a 2P agent. After that, the metal layer 36 was spin-coated with a 50-nm thick 2P agent, and UV imprinting was performed using the resin stamper described previously (FIG. 5C). Subsequently, the residue formed by the imprinting process was removed by using oxygen gas at a chamber pressure of 2 mTorr, a coil RF of 100 W, and a platen RF of 100 W for an etching time of 30 sec (FIG. 5D). The metal layer 36 was then etched by ion beam etching using Ar gas (FIG. 5E). After that, the protective layer C 35 was etched by the ICP etching apparatus by using oxygen gas. A C mask was formed by using oxygen as a process gas at a chamber pressure of 2 mTorr, a coil RF of 100 W, and a platen RF of 100 W for an etching time of 30 sec (FIG. 5F). Ion beam etching was performed through the formed C mask by using He+$N_2$ (mixing ratio of 1:1) (FIG. 5G). ECR was used in the gas ionization, and etching was performed at a microwave power of 800 W and an acceleration voltage of 1,000 V for 20 sec, thereby forming a 10-nm thick patterns of protrusions and recesses that partially divided the ferromagnetic recording layer 34. A 5-nm thick residue of the ferromagnetic recording layer 34 deactivated the magnetism owing to the effect of the exposure to He+$N_2$, thereby forming a magnetism-deactivated layer 34'. At the same time, the metal layer 36 (Cu) deposited in the step shown in FIG. 5A was completely removed. After that, the C mask was removed by RIE using oxygen gas at 100 mTorr and 100 W for an etching time of 30 sec (FIG. 5H), and a 4-nm thick surface C protective film 39 was formed by CVD (FIG. 5I) and coated with a lubricant, thereby obtaining a DTR medium 40.

The manufactured DTR medium had a track pitch of 75 nm, a recording track width of 50 nm, and a groove width of 25 nm. After being coated with the lubricant, the DTR medium was incorporated into an HDD drive and evaluated. Consequently, the read/write head positioning accuracy was 6 nm, and the on-track BER was 10 to the −5th power.

Comparative Example 6

Example in which Master and DTR Medium were Manufactured at Implantation Energy of 20 keV or More A DTR medium was manufactured following the same procedure as in Example 7 except that the master (the implantation energy was 30 keV) obtained in Comparative Example 4 was used.

When using the manufactured DTR medium, it was impossible to perform the positioning (servo tracking) of a read/write head because the pattern deformation of the master was large.

Example 8

Manufacture Example of BPM

A BPM was manufactured following the same procedure as in Example 5 except that the pattern shown in FIG. 3 was written by EB lithography. The bit size of the manufactured BPM was 35 nm×15 nm. Since the BER of the BPM cannot be defined, comparison was performed using the signal amplitude intensity. The BPM was magnetized in one direction and incorporated into a drive, and a reproduced waveform was observed. As a consequence, a signal amplitude intensity of 200 mV was obtained. The read/write head positioning accuracy was 6 nm. This reveals that the use of the master of the embodiment makes it possible to manufacture a BPM having a finer pattern by the same manufacturing method as that of a DTR medium.

As described above, the master of the embodiment can reduce the rectangularity. Therefore, a father stamper can be formed from an Si master by performing electroforming that suppresses the formation of burrs. Also, since the conductivity can be ensured by decreasing the resistance of Si, no conductive film sputtering is performed. Accordingly, fine patterns can be electroformed. In addition, it is possible to suppress a level difference due to uneven separation when manufacturing a mother stamper. This makes it possible to suppress the bridge of a DTR medium and BPM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electroforming master comprising:
   patterns of protrusions and recesses on one major surface of an silicon (Si) substrate comprising two major surfaces, in accordance with information for positioning of a read/write head, and recording tracks or recording bits, in which a recess width is 10 nm or less;
   impurity ions doped in a surface of the patterns of protrusions and recesses, wherein
   a distribution of an impurity ion concentration in a film thickness direction of the Si substrate comprises a peak in a portion from the surface of the patterns of protrusions and recesses to a depth of 40 nm in the film thickness direction; and
   an impurity concentration of the peak is $1 \times 10^{20}$ to $2 \times 10^{21}$ ions/cm$^3$.

2. The master of claim 1, wherein the impurity comprises one of phosphorus and a compound containing phosphorus.

3. The master of claim 1, wherein the impurity comprises arsenic and boron.

4. The master of claim 1, wherein the impurity comprises antimony, tin, gallium, aluminum, and lithium.

5. An electroforming master manufacturing method comprising:
   forming a mask layer on an Si substrate;
   coating the mask layer with an Electron Beam (EB) lithography resist having an etching selectivity lower than that of the mask layer, thereby forming an EB lithography resist coating layer;
   writing pattern of information for positioning of a read and write head, and recording tracks or recording bits, on the EB lithography resist coating layer by using an EB lithography apparatus, and developing the pattern, thereby forming an EB lithography resist pattern;
   forming a mask pattern by etching the mask layer via the EB lithography resist pattern;
   forming a patterns of protrusions and recesses on the Si substrate by etching the Si substrate via the mask pattern;
   removing the EB lithography resist pattern and the mask pattern by aching; and
   modifying a surface of the patterns of protrusions and recesses by doping impurity ions in the surface of the patterns of protrusions and recesses at an implantation energy of 5 to 20 keV.

6. The method of claim 5, wherein the impurity comprises at least phosphorus, and, after the impurity ions are doped, the doped impurity ions are thermally diffused by further heating the surface of the patterns of protrusions and recesses, thereby redistributing the impurity and removing a surface oxide film.

7. The method of claim 5, wherein the impurity ions are doped at an implantation energy of 5 to 20 keV.

8. The method of claim 5, wherein the mask layer comprises a stack comprising a carbon mask layer and a silicon mask layer.

9. The method of claim 5, wherein the writing pattern of information for positioning of the read and write head comprises a preamble, an address and a burst.

* * * * *